United States Patent [19]

Barry et al.

[11] 3,891,887

[45] June 24, 1975

[54] SEMICONDUCTOR DEVICES

[75] Inventors: David Edward Barry, Braintree; Peter Edward Steigmann, Heybridge, both of England

[73] Assignee: English Electric Valve Company Limited, Chelmsford, England

[22] Filed: Oct. 3, 1973

[21] Appl. No.: 403,043

[52] U.S. Cl. .................... 315/3; 313/366; 315/3.5; 357/30

[51] Int. Cl. .................... H01j 23/16; H01j 27/96

[58] Field of Search .................... 315/3, 3.5 X, 3.5; 313/65 AB, 366, 367, 368; 317/235; 357/30, 37

[56] References Cited

UNITED STATES PATENTS

| | | | |
|---|---|---|---|
| 3,289,024 | 11/1966 | Haan et al. | 313/65 AB |
| 3,564,309 | 2/1971 | Hoeberechts et al. | 313/65 AB |
| 3,721,848 | 3/1973 | Knippenberg et al. | 317/235 |
| 3,732,456 | 5/1973 | Buck | 315/3 |
| 3,748,549 | 7/1973 | Singer et al. | 317/235 |
| 3,749,961 | 7/1973 | Bates et al. | 315/3 |

*Primary Examiner*—Saxfield Chatmon, Jr.

*Attorney, Agent, or Firm*—Baldwin, Wight & Brown

[57] ABSTRACT

A semiconductor crystal having a target area and an oxide insulation layer on the same planar surface and a barrier of X-ray absorbent material in a direct line between the target and the interface between the semiconductor material and the oxide insulation layer to protect the interface against X-rays.

3 Claims, 2 Drawing Figures

SEMICONDUCTOR DEVICES

This invention relates to semiconductor devices and in particular to planar semiconductor devices intended to be bombarded by an intense beam of electrons in a vacuum tube such as an electron beam semiconductor (E.B.S.) amplifier.

Such an amplifier operates on the principle of creation within a semiconductor target of multiple electron-hole carrier pairs for each electron in an incident high energy electron beam to achieve amplification of the beam current. Thus, a typical E.B.S. amplifier comprises an electron gun producing a laminar flow electron beam which is deflected by means of a meander line down which travels an R.F. signal to be amplified. By contrast with conventional R.F. amplifiers such as travelling wave tubes the electron beam current is not modulated but instead the electron beam is deflected by the R.F. signal onto one of two semiconductor targets which together may be considered to constitute a Class B amplifier. The semiconductor targets each comprise a p-n junction which is reverse biased by a suitable D.C. supply so that in the absence of an incident electron beam there is ideally no current flow. When electrons from a beam are incident on the semiconductor electron-hole pairs are created which result in a current through the p-n junction linearly related to the beam current over a very wide range of frequencies.

A problem which has been found in E.B.S. amplifiers stems from the fact that X-rays given off during collisions of the beam electrons with the semiconductor target adversely affect the interface between the semiconductor crystal and an oxide insulating layer formed on the crystal at regions where the space-charge region of the p-n junction intercepts the surface of the crystal and tend to reduce the operating life of the semiconductor device. This problem is believed to be caused by the X-rays changing the concentration of fast interface states or recombination centres in the semiconductor oxide interface leading to increases in leakage current in the reverse bias and to a lesser extent by the X-rays changing the density of the stored fixed charge within the oxide layer leading to premature failure through, for example, field induced breakdown.

According to the present invention, a semiconductor crystal has a target area adapted to be bombarded with electrons and an oxide insulation layer on the same planar surface and is provided with a barrier of X-ray absorbent material in a direct line between the target and the X-ray sensitive interface between the semiconductor material and the oxide insulation layer.

The X-ray absorbent material may conveniently be gold or lead and may be deposited in a channel in the planar surface between the target area and the oxide/-crystal interface.

The invention will now be described further, by way of example, with reference to the accompanying drawings in which.

Figure 1:
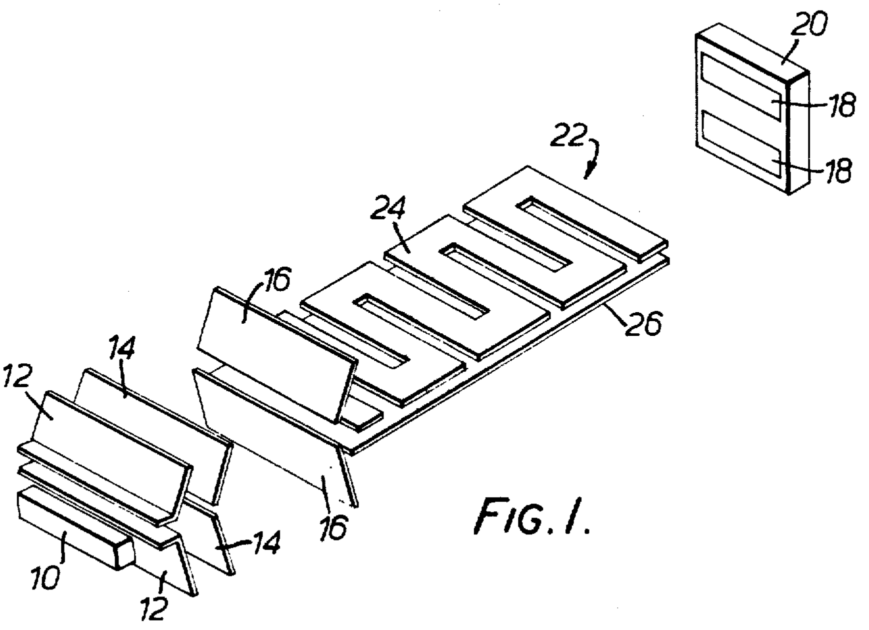
FIG. 1 is a schematic perspective view of an E.B.S. amplifier.

Referring first to FIG. 1, an E.B.S. amplifier comprises, within an envelope which is not illustrated, a cathode 10 which emits electrons which are then focused by means of focusing electrodes 12, 14 and 16 to form a laminar beam. The cathode 10 and the beam focusing electrodes 12, 14 and 16 together form an electron gun the beam from which is directed onto twin semiconductor targets 18 mounted on a heat sink 20 after deflection through a deflection system 22 comprising a meander line 24 and a ground plate 26. The R.F. signal to be amplified is applied to the meander line 24 and thus deflects the laminar beam between the two semiconductor targets 18 each of which then passes a current proportioned to the percentage of the total beam incident upon it. The general construction of an E.B.S. amplifier is itself already known in the art and will therefore not be described in any greater detail.

Figure 2:
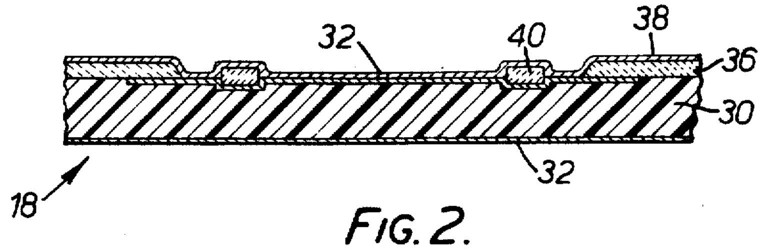
FIG. 2 is a section through a semiconductor for use in an E.B.S. amplifier and constructed in accordance with the present invention.

Referring now to FIG. 2, this shows a cross section through one of the targets 18 which consists essentially of a p-n junction. It should be appreciated that FIG. 2 is not intended to be a scale drawing of the target but instead some features have been exaggerated to facilitate understanding. The underside of a p-type silicon crystal 30 contacts a metal coating 32 which forms one of the contacts of the device. An n-type region 34 is diffused into the top side of the crystal and an oxide layer 36 is formed on the top surface over the junction between the p and n type regions. A metallisation coating 38 is then formed over the whole top side of the semiconductor crystal to establish an electrical connection with the n-type region 34.

When the target is used, an electron beam falls onto the n-type region 34 and this in turn generates electron-hole pairs which flow under a field applied between the metal contacts 32 and 38 to produce an external current the magnitude of which is determined by the electron beam current. At the same time X-rays are produced and in the absence of suitable measures to counteract their effect act upon the interface between the oxide layer 36 and the semiconductor crystal in such a manner as to reduce the useable life of the target. This problem is counteracted in the target illustrated in FIG. 2 by means of a barrier 40 which is made of an X-ray absorbent material such as gold or lead which surrounds the target area of the semiconductor. The X-ray absorbent material lies in a direct line between the target area and the interface between the oxide layer 36 and the crystal 30 and provided that it is suitably dimensioned, this barrier can reduce the effect of X-rays on this interface to such an extent that the useable life of the target matches that of the electron gun.

Though this invention has clear application in the field of E.B.S. amplifiers, it will be appreciated that it can also be used in any situation where X-rays attack an interface between a crystal and an oxide layer on the crystal.

We claim:

1. In a vacuum tube such as an electron beam semiconductor amplifier including a semiconductor crystal having a p-n junction target area adapted to be bombarded with electrons, an electron beam source spaced from said target area and adapted to generate a beam of electrons of sufficient intensity as to give off x-rays incidental to bombardment of the target area with such beam of electrons, and a deflection system between said source and said target area to deflect said electron beam to bombard said target area, and an oxide insulation layer on the crystal, the interface between the semiconductor material of the crystal and the oxide insulation layer being sensitive to x-rays, the improvement wherein said crystal includes a planar surface, the oxide insulation layer being formed on said planar surface to define a planar x-ray sensitive interface and said p-n junction being formed at said planar surface to define a planar target area spaced from said x-ray sensitive interface, and a barrier of x-ray absorbent material is provided in a direct line between the interface defining said target area and the x-ray sensitive interface.

2. A semiconductor crystal as claimed in claim 1, in which the X-ray absorbent material is gold or lead.

3. A semiconductor crystal as claimed in claim 1 in which the X-ray absorbent material is deposited in a channel in the planar surface between the target area and the oxide/crystal interface.

* * * * *

UNITED STATES PATENT AND TRADEMARK OFFICE
CERTIFICATE OF CORRECTION

PATENT NO. : 3,891,887

DATED : June 24, 1975

INVENTOR(S) : David Edward Barry and Peter Edward Steigmann

It is certified that error appears in the above-identified patent and that said Letters Patent are hereby corrected as shown below:

In the patent heading, insert

Foreign Application Priority Data

Oct. 3, 1972 United Kingdom 45,438/72

Signed and Sealed this

*twenty-sixth* Day of *August 1975*

[SEAL]

*Attest:*

RUTH C. MASON
*Attesting Officer*

C. MARSHALL DANN
*Commissioner of Patents and Trademarks*